US010535612B2

(12) United States Patent
Chen

(10) Patent No.: US 10,535,612 B2
(45) Date of Patent: Jan. 14, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Yi Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/844,415

(22) Filed: Dec. 15, 2017

(65) Prior Publication Data

US 2019/0189565 A1 Jun. 20, 2019

(51) Int. Cl.
*H01L 23/552* (2006.01)
*H01L 23/498* (2006.01)
*H01L 23/31* (2006.01)
*H01L 25/16* (2006.01)
*H01L 21/56* (2006.01)
*H01L 21/48* (2006.01)
H01L 23/00 (2006.01)

(52) U.S. Cl.
CPC ........ *H01L 23/552* (2013.01); *H01L 21/4853* (2013.01); *H01L 21/565* (2013.01); *H01L 23/3128* (2013.01); *H01L 23/49816* (2013.01); *H01L 23/49838* (2013.01); *H01L 25/16* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/19041* (2013.01); *H01L 2924/19102* (2013.01); *H01L 2924/19105* (2013.01); *H01L 2924/3025* (2013.01)

(58) Field of Classification Search
CPC ............. H01L 23/552; H01L 23/3128; H01L 23/49816; H01L 23/49838; H01L 21/4853; H01L 21/565; H01L 24/16; H01L 24/32; H01L 24/73; H01L 25/16; H01L 2224/16225; H01L 2224/32225; H01L 2224/73204; H01L 2924/19041; H01L 2924/19102; H01L 2924/19105; H01L 2924/3025
USPC ....................................................... 257/659
See application file for complete search history.

(56) References Cited

U.S. PATENT DOCUMENTS 8,378,477 B2 2/2013 Do et al.
8,766,416 B2 7/2014 Hsu et al.
(Continued)

*Primary Examiner* — Tong-Ho Kim
(74) *Attorney, Agent, or Firm* — Foley & Lardner LLP; Cliff Z. Liu

(57) ABSTRACT

A semiconductor device package includes a substrate, a first electronic component, a first package body, an electrical contact and a first conductive layer. The substrate has a first surface, a second surface and a lateral surface extending between the first surface and the second surface. The first electronic component is disposed on the first surface of the substrate. The first package body encapsulates the first electronic component. The electrical contact is disposed on the second surface of the substrate. The first conductive layer includes a first portion and a second portion. The first portion is disposed on the first package body and the lateral surface of the substrate. The second portion contacts the electrical contact.

19 Claims, 17 Drawing Sheets

(56) References Cited

U.S. PATENT DOCUMENTS

| | | | |
|---|---|---|---|
| 2013/0257462 A1* | 10/2013 | Ding | G01R 1/0433 |
| | | | 324/705 |
| 2015/0235966 A1* | 8/2015 | Ohhashi | H01L 23/552 |
| | | | 257/659 |
| 2016/0035678 A1* | 2/2016 | Yoo | H01L 23/552 |
| | | | 257/659 |
| 2018/0138155 A1* | 5/2018 | Kim | H01L 23/552 |

\* cited by examiner

SEMICONDUCTOR DEVICE PACKAGE AND METHOD OF MANUFACTURING THE SAME

BACKGROUND

1. Technical Field

The present disclosure generally relates to a semiconductor device package, and to a semiconductor device package with a shielding layer directly connected to a ground terminal.

2. Description of the Related Art

In a semiconductor device package, a molding technique can be used to encapsulate a semiconductor device to form a package body for protection.

A shielding layer may be formed on the package body to reduce or mitigate electromagnetic interference (EMI). The shielding layer can be electrically connected to a ground layer in a substrate for packaging or assembling the semiconductor device. Therefore, arrangement of the ground layer may increase the cost and size of the semiconductor device package.

SUMMARY

In some embodiments, a semiconductor device package includes a substrate, a first electronic component, a first package body, an electrical contact and a first conductive layer. The substrate has a first surface, a second surface and a lateral surface extending between the first surface and the second surface. The first electronic component is disposed on the first surface of the substrate. The first package body encapsulates the first electronic component. The electrical contact is disposed on the second surface of the substrate. The first conductive layer includes a first portion and a second portion. The first portion is disposed on the first package body and the lateral surface of the substrate. The second portion contacts the electrical contact.

In some embodiments, a method of manufacturing a semiconductor device package includes the following operations: providing a substrate; disposing a package body on the substrate; disposing an electrical contact on the substrate; and forming a conductive layer on the substrate and the package body to contact the electrical contact.

Figure 1A:
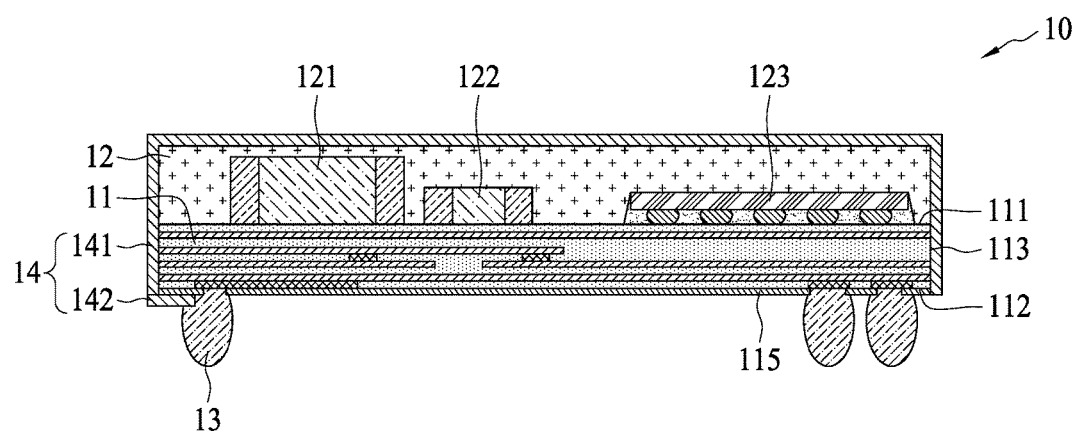
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

In one or more embodiments, conductive material forms a shielding layer and may be extended from a lateral surface of a substrate to external connection elements (e.g. solder balls/bumps) of a semiconductor device package by a plating technique (e.g. to control the overflow of the conductive material) or a sputtering technique (e.g. a double side/dual side sputtering technique).

FIG. 1A illustrates a cross-sectional view of a semiconductor device package 10 in accordance with some embodiments of the present disclosure. The semiconductor device package 10 includes a substrate 11, an electronic component 121, a first package body 12, an electrical contact 13 and a first conductive layer 14. The substrate 11 has a first surface 111, a second surface 112 and a lateral surface 113 extending between the first surface 111 and the second surface 112. The electronic component 121 is disposed on the first surface 111 of the substrate 11. The electronic component 121 may include, for example, a die, a chip, an application specific integrated circuit, or a passive electronic device (e.g. a capacitor). The first package body 12 encapsulates the electronic component 121. The electrical contact 13 is disposed on the second surface 112 of the substrate 11. The first conductive layer 14 includes a first portion 141 and a second portion 142. The first portion 141 is disposed on the first package body 12 and the lateral surface 113 of the substrate 11. The second portion 142 contacts the electrical contact 13. In some embodiments, another electronic component 122 is disposed on the first surface 111 of the substrate 11. In some embodiments, the second portion 142 of the first conductive layer 14 contacts the second surface 112 of the substrate 11. In some embodiments, an electronic component 123 is also disposed on the first surface 111 of the substrate 11. In some embodiments, one or more conductive patterned layers are disposed within the substrate. In some embodiments, the semiconductor device package 10 further includes a solder mask layer 115.

The solder mask layer 115 may serve to protect the second surface 112 of the substrate 11. In some embodiments, the solder mask layer 115 is, or includes, a photosensitive dry film or other patternable material, such as a polyimide. In some embodiments, the solder mask layer 115 is, or includes, a solder resist. Openings are defined by the solder mask layer 115 to expose a portion of the second surface 112 of the substrate 11 for external electrical connection, and one or more of the electrical contacts 13 can be disposed in the openings. In some embodiments, the second portion 142 of the first conductive layer 14 is disposed in such openings. Such openings may be any suitable shape, including without limitation: columnar (such as cylindrical, elliptic columnar, square columnar, rectangular columnar, or other columnar shape) or non-columnar (such as conical, funnel-shaped, or other non-columnar shape). A side wall of an opening defined by the solder mask layer 115 may be in the shape of an arc. A side wall of an opening defined by the solder mask layer 115 may have a texture. In some embodiments, the solder mask layer 115 may constitute at least a portion of the second surface 112 of the substrate 11.

In some embodiments, a thickness of the first portion 141 is greater than a thickness of the second portion 142. In some embodiments, the thickness of the first portion 141 is at least about three times greater than the thickness of the second portion 142 (e.g. the thickness of the first portion 141 is greater than the thickness of the second portion 142 by a factor of about 4 or more, by a factor of about 5 or more, or by a factor of about 6 or more).

In some embodiments, the electrical contact 13 can be a solder bump, a metal pillar (e.g., a copper pillar or a pillar including another conductive metal or alloy), a conductive bump including a copper core surrounded by a solder shell (e.g., a shell including tin (Sn)), or a conductive bump including a higher melting temperature (melting point) solder core (e.g., including a higher melting temperature tin alloy) surrounded by a lower melting temperature solder shell (e.g., including a lower melting temperature tin alloy).

In some embodiments, the first conductive layer 14 functions as a shielding layer on the package body 12 to reduce or mitigate EMI and can be electrically connected to a ground layer in the substrate 11. By directly connecting the second portion 142 of the first conductive layer 14 to the electrical contact 13, a cost of manufacturing the substrate 11 and the dimensions of a semiconductor device package that includes the substrate 11 can be reduced.

Figure 1B:
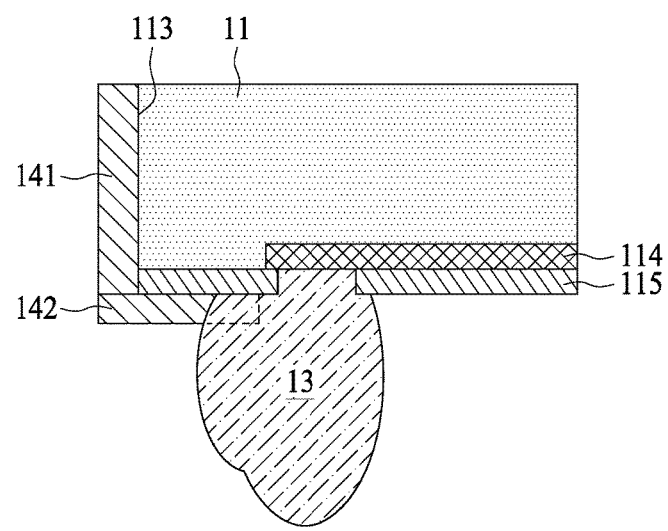
FIG. 1B illustrates a cross-sectional view of a portion of the semiconductor device package shown in FIG. 1A in accordance with some embodiments of the present disclosure.

FIG. 1B illustrates a cross-sectional view of a portion of the semiconductor device package 10 shown in FIG. 1A in accordance with some embodiments of the present disclosure. As shown in FIG. 1B, the first portion 141 is disposed on the lateral surface 113 of the substrate 11. The electrical contact 13 electrically contacts the second portion 142, and can partially cover the second portion 142. In some embodiments, the electrical contact 13 covers a portion of the second portion 142. As shown in FIG. 1B, the second portion 142 does not directly contact a ground pad 114 (which can be electrically connected to, or can constitute, a ground layer) within the substrate 11. The ground pad 114 is electrically connected to the second portion 142 through the electrical contact 13. In some embodiments, the second portion 142 directly contacts the ground pad 114 within the substrate 11.

Figure 1C:
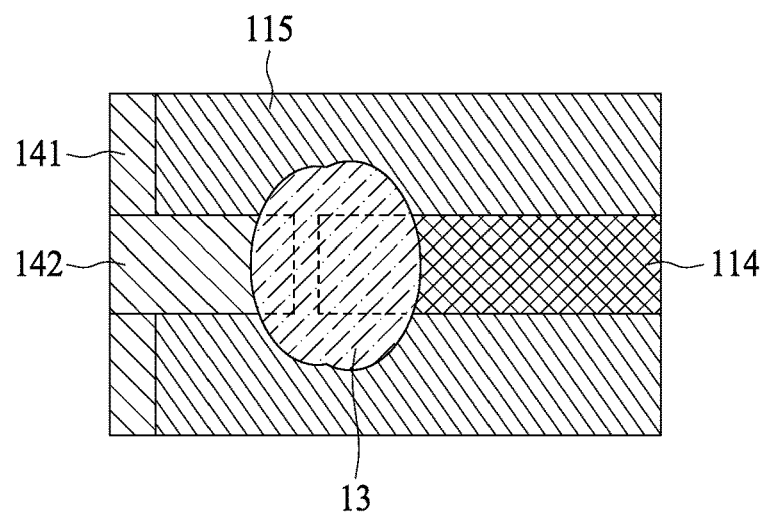
FIG. 1C illustrates a bottom view of the portion of the semiconductor device package shown in FIG. 1B.

FIG. 1C illustrates a bottom view of the portion of the semiconductor device package shown in FIG. 1B. As shown in FIG. 1C, the second portion 142 does not directly contact the ground pad 114 within the substrate 11.

Figure 1D:
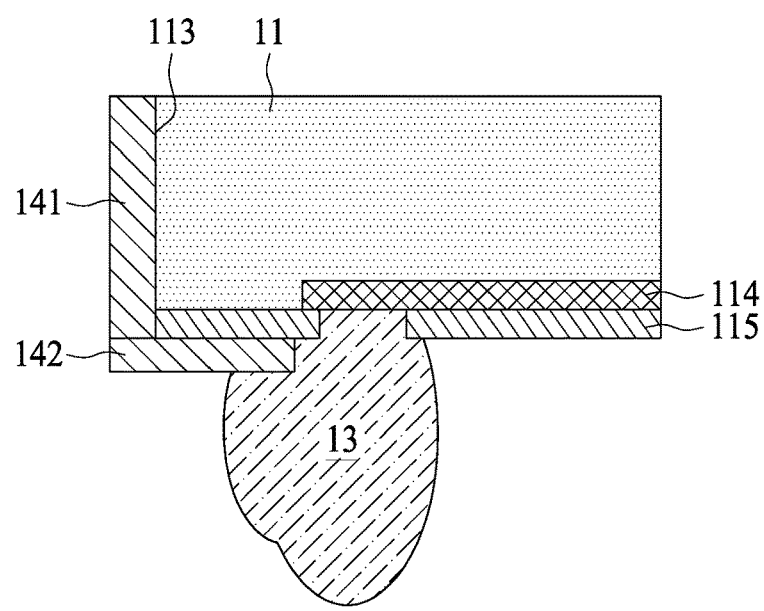
FIG. 1D illustrates a cross-sectional view of a portion of the semiconductor device package shown in FIG. 1A in accordance with some embodiments of the present disclosure.

FIG. 1D illustrates a cross-sectional view of a portion of the semiconductor device package shown in FIG. 1A in accordance with some embodiments of the present disclosure. As shown in FIG. 1D, the first portion 141 is disposed on the lateral surface 113 of the substrate 11. The second portion 142 electrically contacts the electrical contact 13 by extending to and partially surrounding (or abutting) the electrical contact 13. In some embodiments, the second portion 142 includes a protrusion covering a portion of the electrical contact 13 (shown in FIG. 1E). As shown in FIG. 1D, the second portion 142 does not directly contact the ground pad 114 within the substrate 11. The ground pad 114 is electrically connected to the second portion 142 through the electrical contact 13.

Figure 1E:
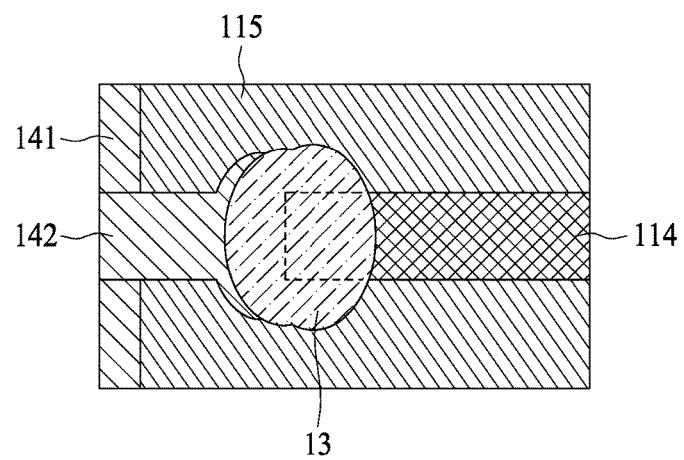
FIG. 1E illustrates a bottom view of the portion of the semiconductor device package shown in FIG. 1D.

FIG. 1E illustrates a bottom view of the portion of the semiconductor device package shown in FIG. 1D. As shown in FIG. 1E, the second portion 142 partially surrounds the electrical contact 13 (e.g. includes one or more protrusions that extend around at least a portion of the electrical contact 13, and cover 10% or more of a circumference of the electrical contact 13, cover 20% or more of the circumference, cover 30% or more of the circumference, cover 40% or more of the circumference, or more) and does not directly contact the ground pad 114 within the substrate 11. By applying the structure shown in FIGS. 1D and 1E, the contact area between the second portion 142 and the electrical contact 13 is increased so that the reliability is also increased and the possibility of peeling between the second portion 142 and the electrical contact 13 is decreased.

Figure 2:
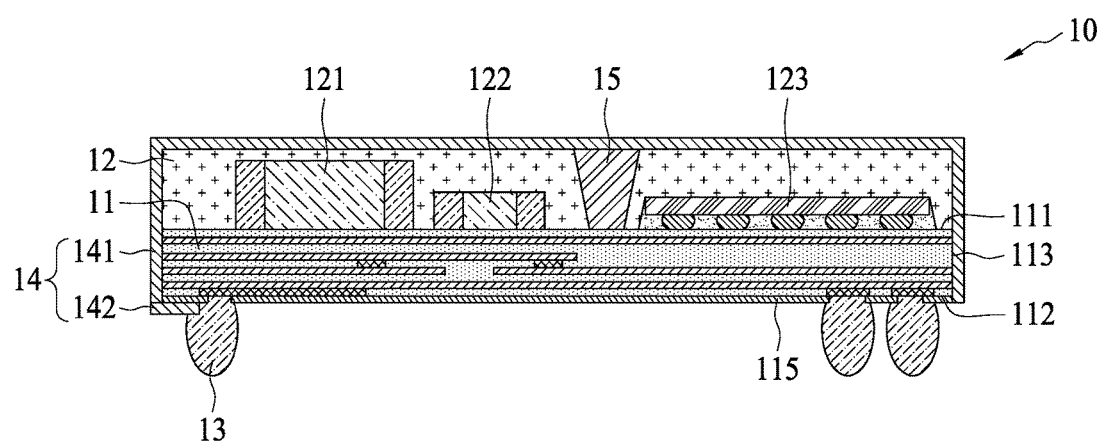
FIG. 2 illustrates a cross-sectional view of a semiconductor device package in accordance with some embodiments of the present disclosure.

FIG. 2 illustrates a cross-sectional view of a semiconductor device package 10 in accordance with some embodiments of the present disclosure. The semiconductor device package shown in FIG. 2 is similar to the semiconductor device package shown in FIG. 1A, with differences including that a first conductive element 15 is disposed in the first package body 12 and separates, or is disposed between, the electronic component 121 (and/or electronic component 122) and the electronic component 123. The conductive material of the first conductive element 15 forms an EMI compartment shielding. The EMI compartment shielding can help to isolate the electronic components 121/122 and the electronic component 123, and allows the electronic components 121/122 and 123 to experience low EMI and to have high electromagnetic compatibility (EMC). Also, such a configuration provides for electronic components 121/122 and 123 with different functions being integrated into the package to reduce a number of elements in the package (e.g.

by implementing suitable specific functionality) so as to decrease the size of the package.

An EMI compartment shielding can be formed by filling a conductive glue into a trench/groove extended from a top surface of a package body to a bottom surface of the package body. The EMI compartment shielding is provided in the package to protect devices or components from EMI, such as EMI arising from other devices (e.g. radio frequency integrated circuits or other components working at relatively high frequency).

Figure 3:
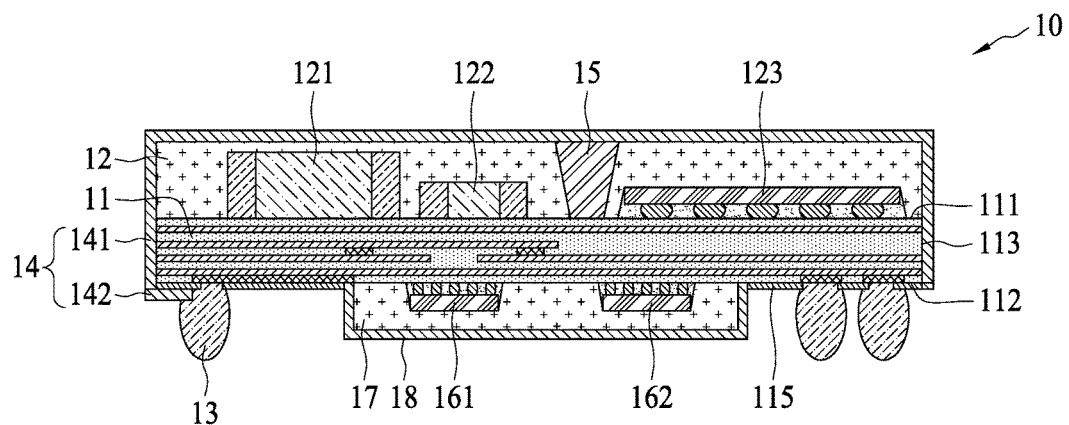
FIG. 3 illustrates a cross-sectional view of a semiconductor device package in accordance with some embodiments of the present disclosure.

FIG. 3 illustrates a cross-sectional view of a semiconductor device package 10 in accordance with some embodiments of the present disclosure. The semiconductor device package 10 shown in FIG. 3 is similar to the semiconductor device package shown in FIG. 2, with differences including that an electronic component 161 and/or an electronic component 162 are disposed on the second surface 112 of the substrate 11. A second package body 17 encapsulates the second electronic component 161. A second conductive layer 18 is disposed on the second molding compound 17. The second conductive layer 18 is electrically connected to the electrical contact 13. In some embodiments, the second conductive layer 14 functions as a shielding layer on the package body 17 to reduce or mitigate EMI.

Figure 4:
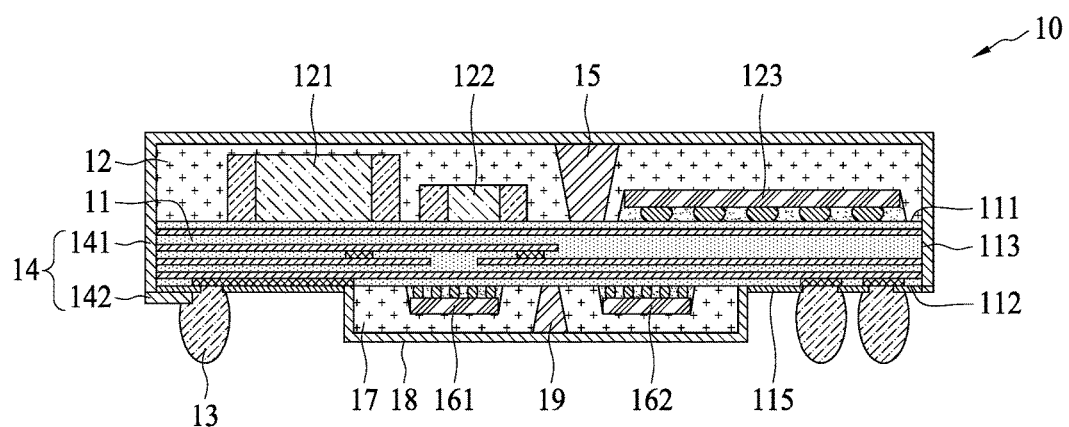
FIG. 4 illustrates a cross-sectional view of a semiconductor device package in accordance with some embodiments of the present disclosure.

FIG. 4 illustrates a cross-sectional view of a semiconductor device package 10 in accordance with some embodiments of the present disclosure. The semiconductor device package 10 shown in FIG. 4 is similar to the semiconductor device package shown in FIG. 3, with differences including that a second conductive element 19 is disposed in the second package body 17 and separates, or is disposed between, the electronic component 161 and the electronic component 162.

Figure 5:
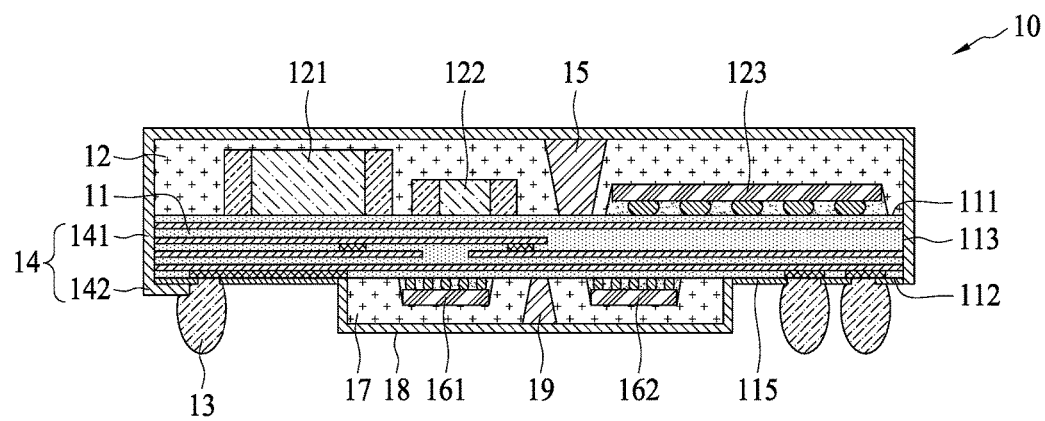
FIG. 5 illustrates a cross-sectional view of a semiconductor device package in accordance with some embodiments of the present disclosure.

FIG. 5 illustrates a cross-sectional view of a semiconductor device package 10 in accordance with some embodiments of the present disclosure. The semiconductor device package 10 shown in FIG. 5 is similar to the semiconductor device package shown in FIG. 4, with differences including that the second portion 142 is extended from the first portion 141 (e.g. the second portion 142 is integral with the first portion 141, or constitutes a monolithic structure including the first portion 141).

Figure 6A:
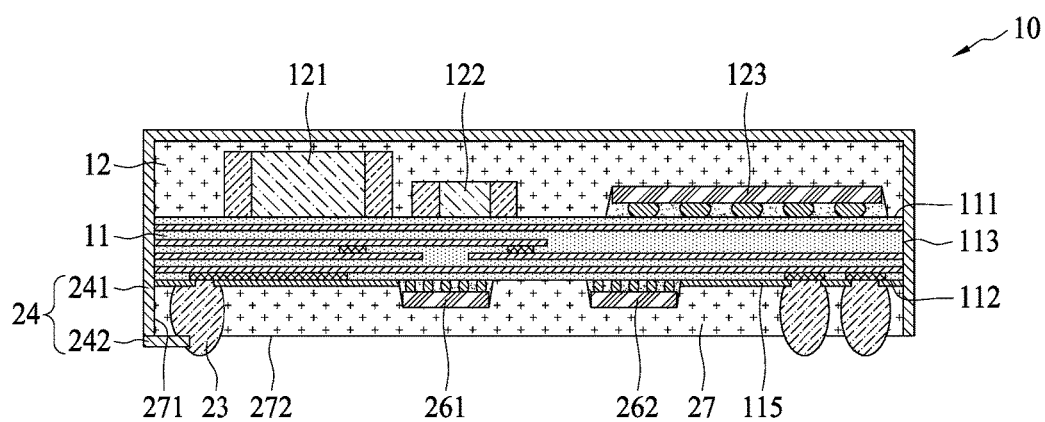
FIG. 6A illustrates a cross-sectional view of a semiconductor device package in accordance with some embodiments of the present disclosure.

FIG. 6A illustrates a cross-sectional view of a semiconductor device package 10 in accordance with some embodiments of the present disclosure. The semiconductor device package 10 shown in FIG. 6A is similar to the semiconductor device package shown in FIG. 1A, with differences including that electronic components 261 and 262 are disposed on the second surface 112 of the substrate 11 and that a second package body 27 encapsulates the electronic components 261 and 262 and the electrical contact 23. The second package body 27 has a lateral surface 271 and a first surface 272. The electrical contact 23 is exposed from (e.g. protrudes from) the first surface 272 of the second molding compound 27.

In some embodiments, the first portion 241 of the first conductive layer 24 is disposed on the lateral surface 271 of the second molding compound 27. The second portion 242 of the first conductive layer 24 is disposed on the first surface 272 of the second molding compound 27. In some embodiments, a third electronic component 123 is disposed on the first surface 111 of the substrate 11

Figure 6B:
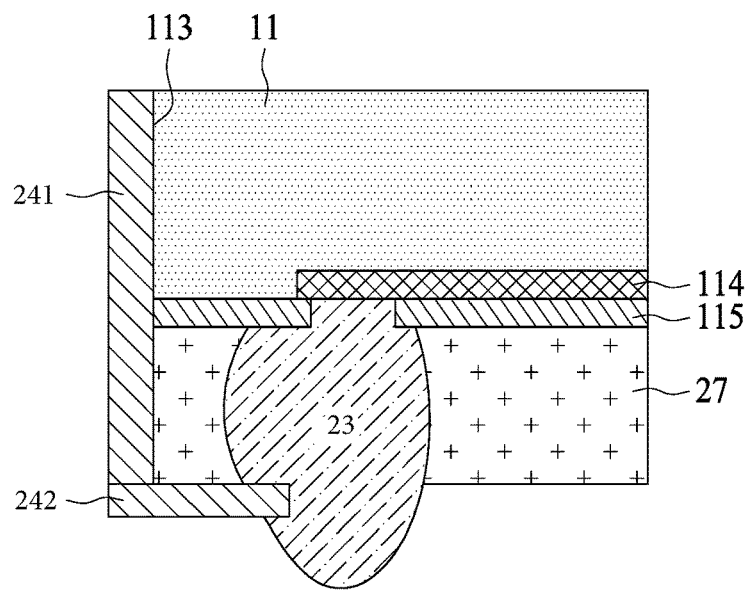
FIG. 6B illustrates a cross-sectional view of a portion of the semiconductor device package shown in FIG. 6A in accordance with some embodiments of the present disclosure.

FIG. 6B illustrates a cross-sectional view of a portion of the semiconductor device package shown in FIG. 6A in accordance with some embodiments of the present disclosure. As shown in FIG. 6B, the first portion 241 is disposed on the lateral surface 113 of the substrate 11. The second portion 242 electrically contacts the electrical contact 23 by extending to and partially surrounding the electrical contact 23. In some embodiments, the second portion 242 includes a protrusion covering a portion of the electrical contact 23 (shown in FIG. 6C). The ground pad 114 is electrically connected to the second portion 242 through the electrical contact 23.

Figure 6C:
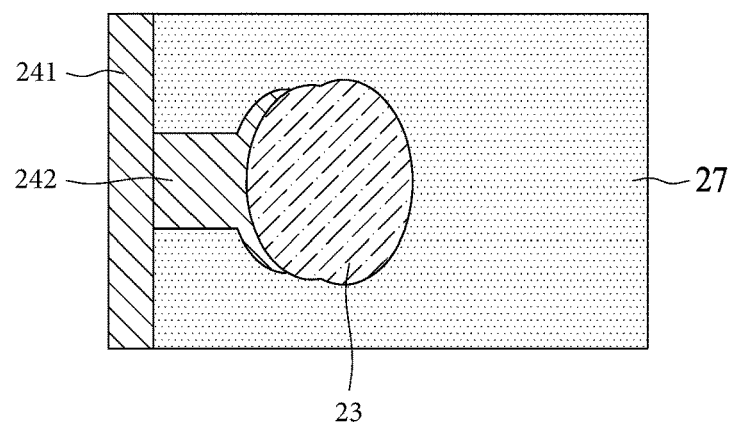
FIG. 6C illustrates a bottom view of the portion of the semiconductor device package shown in FIG. 6B.

FIG. 6C illustrates a bottom view of the portion of the semiconductor device package shown in FIG. 6B. As shown in FIG. 6C, the second portion 242 partially surrounds the electrical contact 23. In some embodiments, the second portion 242 includes a protruding portion covering at least a portion of the electrical contact 23 (e.g. includes one or more protrusions that extend around at least a portion of the electrical contact 23, and cover 10% or more of a circumference of the electrical contact 23, cover 20% or more of the circumference, cover 30% or more of the circumference, cover 40% or more of the circumference, or more).

Figure 7:
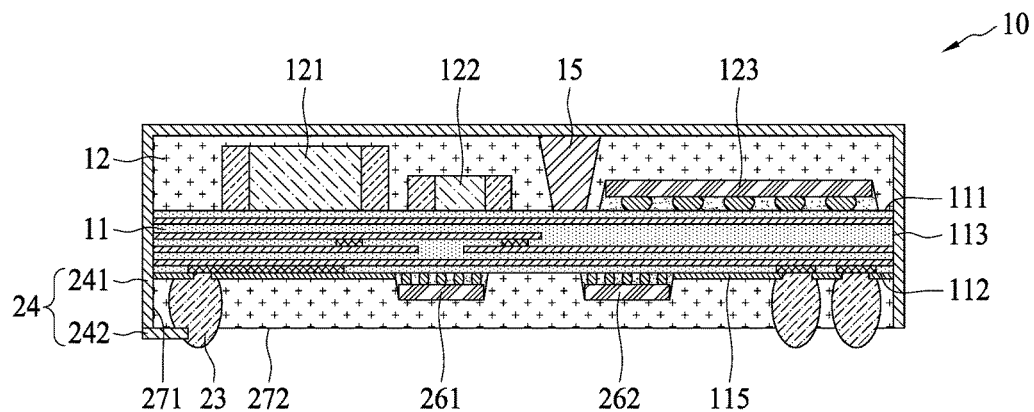
FIG. 7 illustrates a cross-sectional view of a semiconductor device package in accordance with some embodiments of the present disclosure.

FIG. 7 illustrates a cross-sectional view of a semiconductor device package 10 in accordance with some embodiments of the present disclosure. The semiconductor device package 10 shown in FIG. 7 is similar to the semiconductor device package shown in FIG. 6A, with differences including that a first conductive element 15 is disposed in the first package body 12 and separates, or is disposed between, the electronic components 121 and 122, and the electronic component 123.

Figure 8:
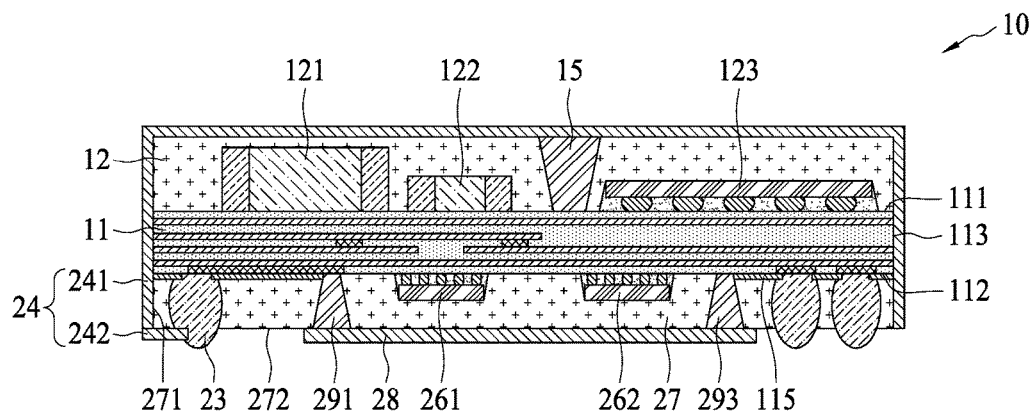
FIG. 8 illustrates a cross-sectional view of a semiconductor device package in accordance with some embodiments of the present disclosure.

FIG. 8 illustrates a cross-sectional view of a semiconductor device package 10 in accordance with some embodiments of the present disclosure. The semiconductor device package 10 shown in FIG. 8 is similar to the semiconductor device package shown in FIG. 7, with differences including that conductive elements 291 and 293 are disposed in the second package body 27 and surround the electronic component 261. In some embodiments, the conductive elements 291 and 293 surround the electronic component 261 and the electronic component 262. In some embodiments, a second conductive layer 28 is disposed on the second package body 27 and connects to the conductive elements 291 and 293. In some embodiments, the conductive elements 291 and 293 are electrically connected to the electrical contact 23. In some embodiments, the conductive elements 291 and 293 are portions of a single ring component surrounding the electronic component 261 and the electronic component 262.

Figure 9:
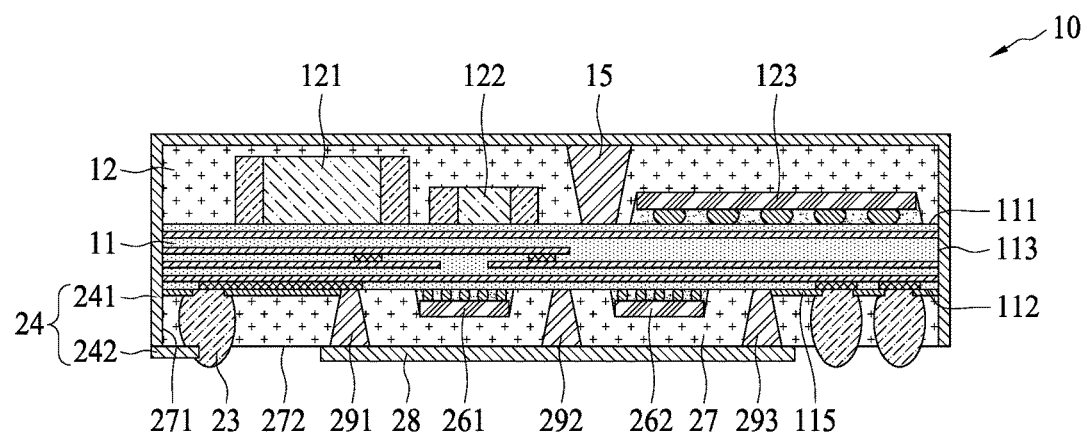
FIG. 9 illustrates a cross-sectional view of a semiconductor device package in accordance with some embodiments of the present disclosure.

FIG. 9 illustrates a cross-sectional view of a semiconductor device package 10 in accordance with some embodiments of the present disclosure. The semiconductor device package 10 shown in FIG. 9 is similar to the semiconductor device package shown in FIG. 8, with differences including that a third conductive element 292 is disposed in the second package body 27 and separates the electronic component 261 from the electronic component 262.

FIG. 10A, FIG. 10B, FIG. 10C, FIG. 10D, FIG. 10E, FIG. 10F and FIG. 10G illustrate a method of manufacturing a semiconductor device package 10 in accordance with some embodiments of the present disclosure.

Figure 10A:
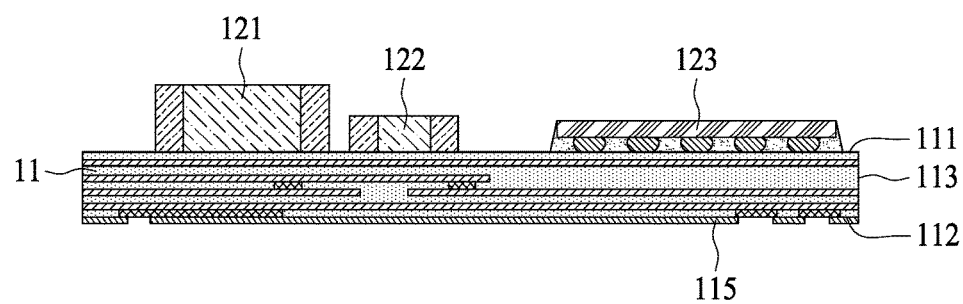
FIG. 10A, FIG. 10B, FIG. 10C, FIG. 10D, FIG. 10E, FIG. 10F and FIG. 10G illustrate a method of manufacturing a semiconductor device package in accordance with some embodiments of the present disclosure.

FIG. 10A illustrates providing a substrate 11. The substrate 11 has a first surface 111, a second surface 112 and a lateral surface 113 extending between the first surface 111 and the second surface 112. An electronic component 121 is disposed on the first surface 111 of the substrate 11. In some embodiments, another electronic component 122 is disposed on the first surface 111 of the substrate 11. In some embodiments, an electronic component 123 is also disposed on the first surface 111 of the substrate 11. In some embodiments, a solder mask layer 115 is disposed on the second surface 112 of the substrate.

Figure 10B:
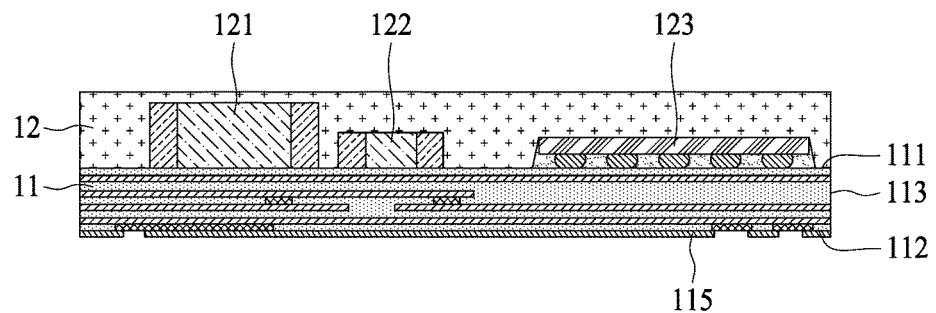

FIG. 10B illustrates disposing a molding compound to form a package body 12 on the substrate 11. The package body 12 encapsulates the electronic components 121, 122 and 123.

Figure 10C:
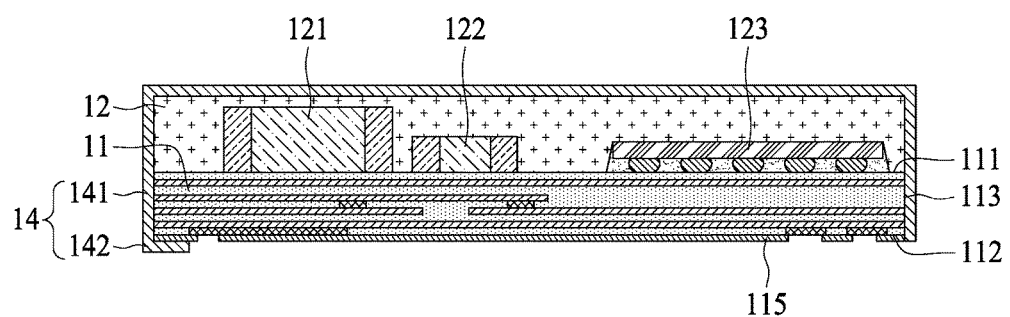

FIG. 10C illustrates forming a conductive layer 14 on the lateral surface 113 of the substrate 11 and the package body 12 shown in FIG. 10B. The conductive layer 14 includes a first portion 141 and a second portion 142. The first portion 141 is disposed on the package body 12 and the lateral surface 113 of the substrate 11. The second portion 142 is disposed on the second surface 112 of the substrate 11.

Figure 10D:
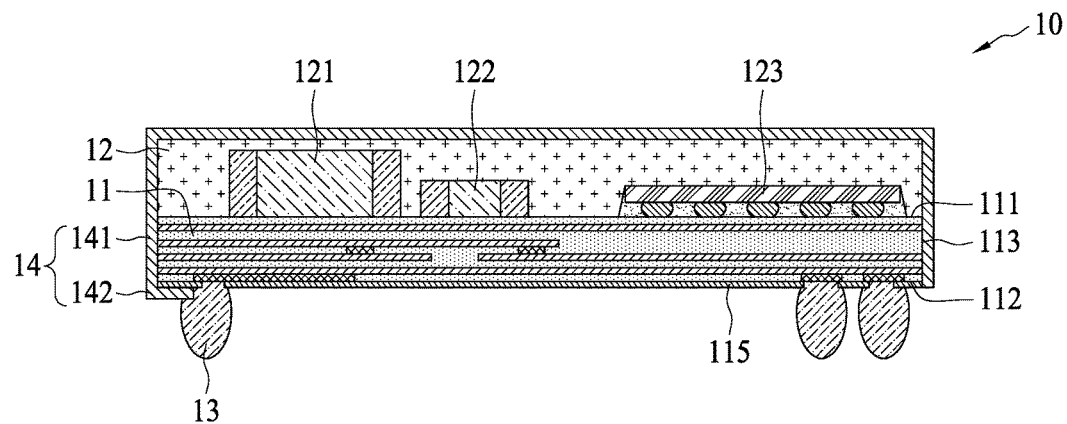

FIG. 10D illustrates disposing an electrical contact 13 on the second surface 112 of the substrate 11 and the solder mask layer 115. In some embodiments, the electrical contact 13 is disposed on the substrate 11 after the conductive layer 14 is formed on the substrate 11 and the package body 12. The second portion 142 of the conductive layer 14 contacts the electrical contact 13. In some embodiments, the structure shown in FIG. 1B and FIG. 1C is then formed. Although FIG. 10A shows openings in the solder mask layer 115 at an early stage of manufacture, the openings can be formed at any time before the electrical contact 13 is formed.

Figure 10E:
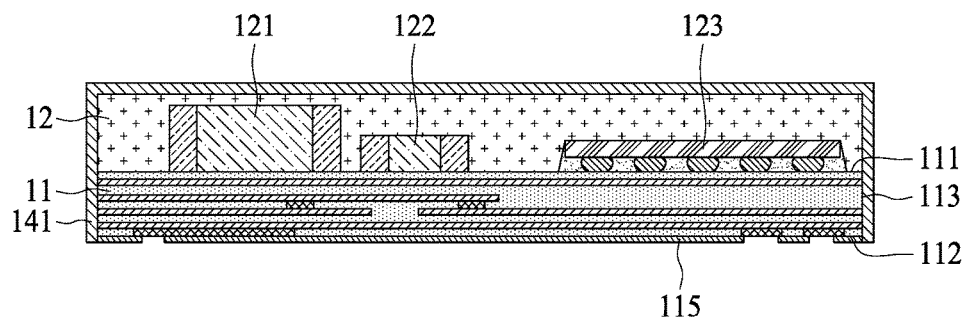

FIG. 10E illustrates forming a first portion 141 of a conductive layer 14 on the lateral surface 113 of the substrate 11 and the package body 12 shown in FIG. 10B. FIG. 10C and FIG. 10E differ at least in that the second portion 142 of the conductive layer 14 is formed at a different time than the first portion 141 of the conductive layer 14 (e.g. the second portion 142 of the conductive layer 14 is formed after the formation of the first portion 141 of the conductive layer 14).

Figure 10F:
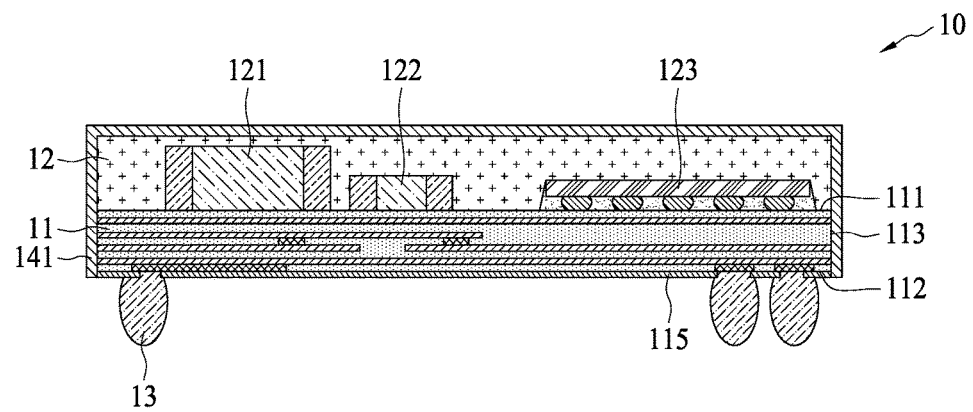

FIG. 10F illustrates disposing the electrical contact 13 on the second surface 112 of the substrate 11 and the solder mask layer 115 shown in FIG. 10E.

Figure 10G:
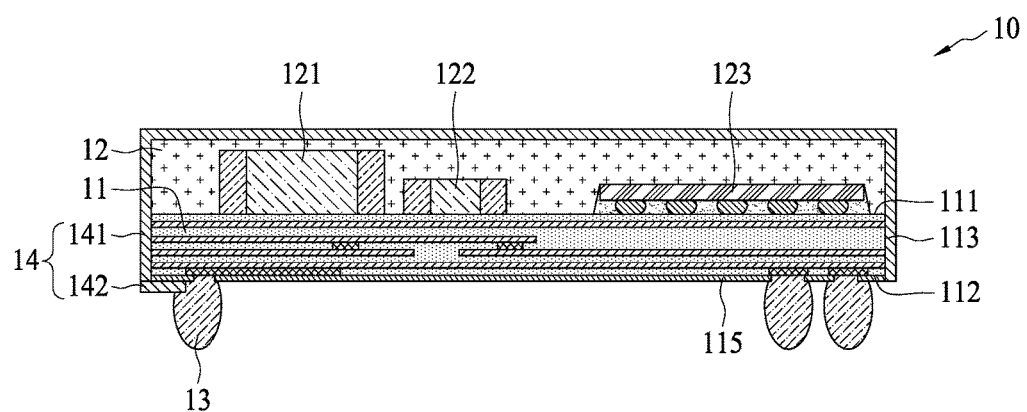

FIG. 10G illustrates forming the second portion 142 of the conductive layer 14 on the second surface 112 of the substrate 11 to contact the electrical contact 13. In some embodiments, the structure of FIG. 1D and FIG. 1E is then formed. In some embodiments, the method further includes reflowing the electrical contact 13. The semiconductor device package 10 of FIG. 10G corresponds to that shown in FIG. 1A.

FIG. 11A, FIG. 11B, FIG. 11C, FIG. 11D, FIG. 11E and FIG. 11F illustrate a method of manufacturing a semiconductor device package in accordance with some embodiments of the present disclosure.

Figure 11A:
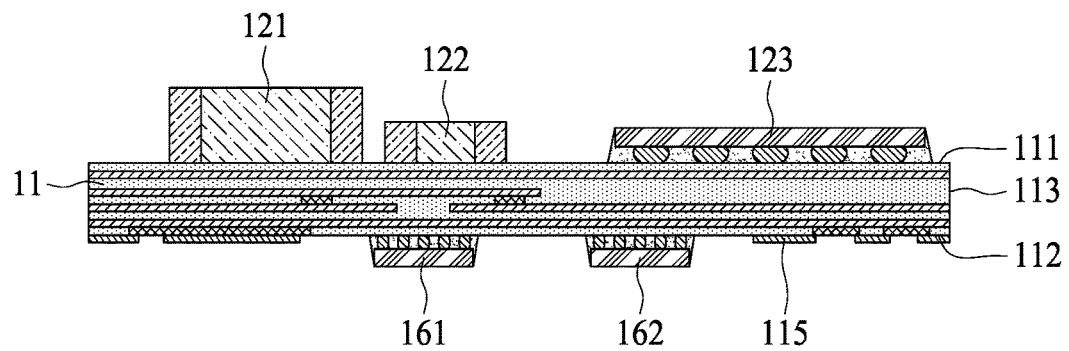
FIG. 11A, FIG. 11B, FIG. 11C, FIG. 11D, FIG. 11E and FIG. 11F illustrate a method of manufacturing a semiconductor device package in accordance with some embodiments of the present disclosure.

FIG. 11A illustrates providing a substrate 11. The substrate 11 has a first surface 111, a second surface 112 and a lateral surface 113 extending between the first surface 111 and the second surface 112. An electronic component 121 is disposed on the first surface 111 of the substrate 11. In some embodiments, another electronic component 122 is disposed on the first surface 111 of the substrate 11. In some embodiments, an electronic component 123 is also disposed on the first surface 111 of the substrate 11. An electronic component 161 and/or an electronic component 162 are disposed on the second surface 112 of the substrate 11. A solder mask layer 115 is disposed on the second surface 112 of the substrate.

Figure 11B:
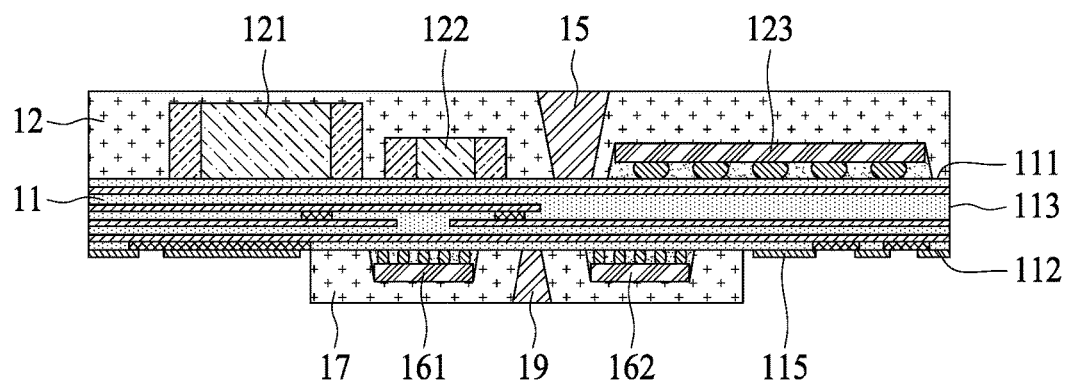

FIG. 11B illustrates disposing a first portion of a molding compound to form a first package body 12 on the first surface 111 of the substrate 11 and disposing a second portion of the molding compound to form a second package body 17 on the second surface 112 of the substrate 11. In some embodiments, the first package body 12 encapsulates the electronic components 121, 122 and 123. The second package body 17 encapsulates the electronic components 161 and 162. In some embodiments, a first conductive element 15 is disposed in the first package body 12 and separates the electronic components 121 and 122 from the electronic component 123. A second conductive element 19 is disposed in the second package body 17 and separates the electronic component 161 from the electronic component 162.

Figure 11C:
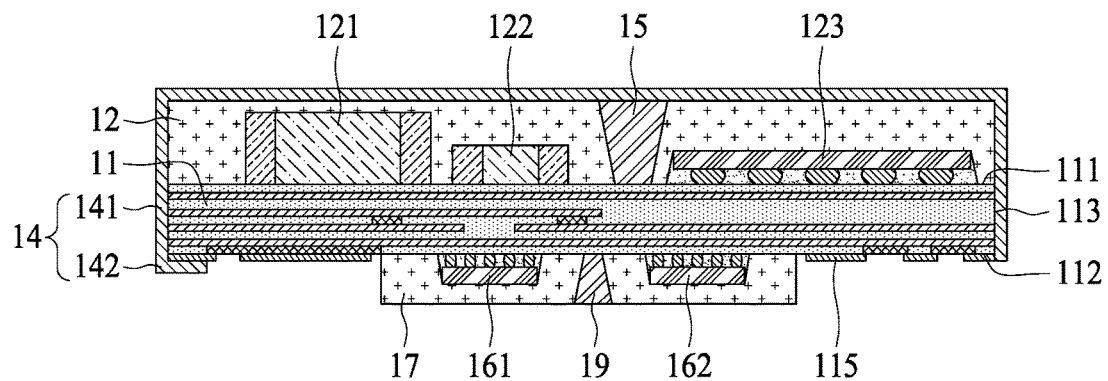

FIG. 11C illustrates forming a conductive layer 14 on the lateral surface 113 of the substrate 11 and the first package body 12 shown in FIG. 11B. The conductive layer 14 includes a first portion 141 and a second portion 142. The first portion 141 is disposed on the first package body 12 and the lateral surface 113 of the substrate 11. The second portion 142 is disposed on the second surface 112 of the substrate 11.

Figure 11D:
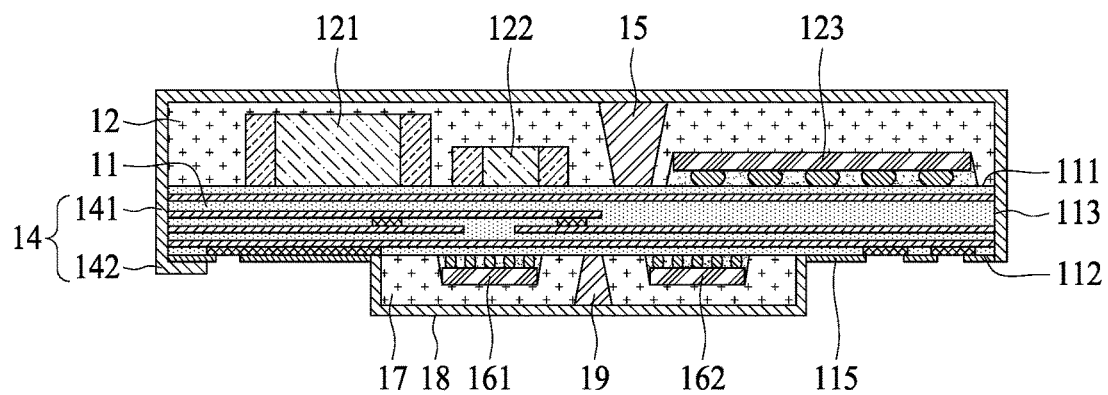

FIG. 11D illustrates forming a conductive layer 18 on the second package body 17. An electrical contact 13 can be disposed on the second surface 112 of the substrate 11 before or after the conductive layer 18 is formed. The second portion 142 of the conductive layer 14 contacts the electrical contact 13. In some embodiments, the structure shown in FIG. 1B and FIG. 1C is then formed. Finally, the semiconductor device package shown in FIG. 5 is formed.

Figure 11E:
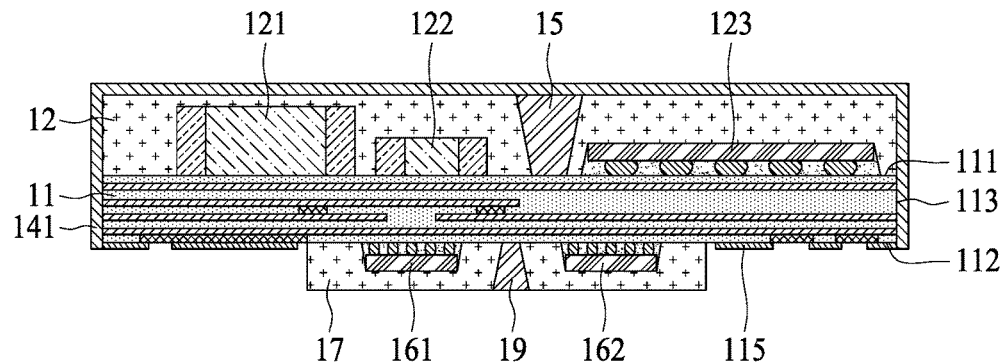

FIG. 11E illustrates forming the first portion 141 of the conductive layer 14 on the lateral surface 113 of the substrate 11 and the first package body 12 shown in FIG. 11B. FIG. 11C and FIG. 11E differ in that the second portion 142 of the conductive layer 14 is formed at a different time than the first portion 141 of the conductive layer 14 (e.g. the second portion 142 of the conductive layer 14 is formed after the formation of the first portion 141 of the conductive layer 14).

Figure 11F:
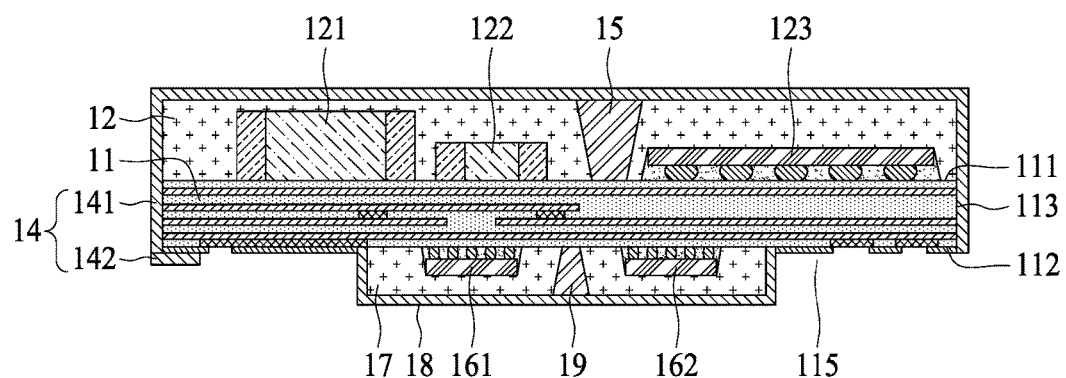

FIG. 11F illustrates forming the conductive layer 18 on the second package body 17 and the second portion 142 of the conductive layer 14 on the second surface 112 of the substrate 11. The electrical contact 13 can be disposed on the second surface 112 of the substrate 11 before or after the conductive layer 18 is formed. The second portion 142 of the conductive layer 14 contacts the electrical contact 13. In some embodiments, the structure shown in FIG. 1D and FIG. 1E is then formed. Finally, the semiconductor device package shown in FIG. 4 is formed. Although FIG. 11A shows openings in the solder mask layer 115 at an early stage of manufacture, the openings can be formed at any time before the electrical contact 13 is formed.

FIG. 12A, FIG. 12B, FIG. 12C, FIG. 12D and FIG. 12E illustrate a method of manufacturing a semiconductor device package in accordance with some embodiments of the present disclosure.

Figure 12A:
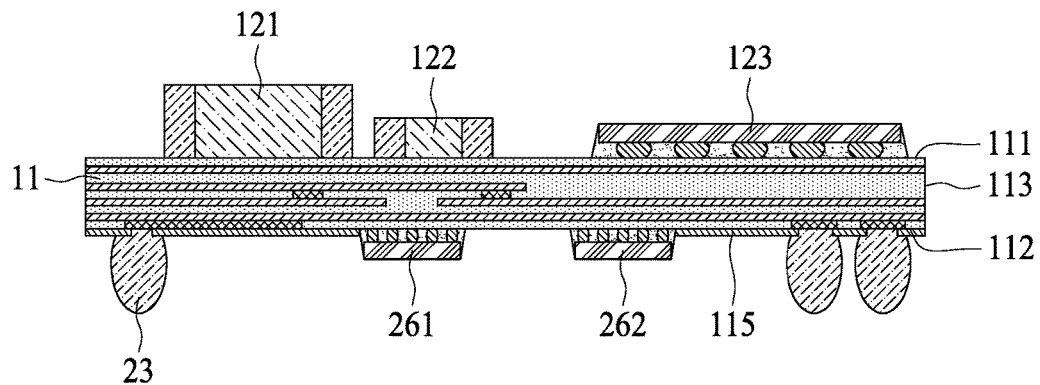
FIG. 12A, FIG. 12B, FIG. 12C, FIG. 12D and FIG. 12E illustrate a method of manufacturing a semiconductor device package in accordance with some embodiments of the present disclosure.

FIG. 12A illustrates providing a substrate 11. The substrate 11 has a first surface 111, a second surface 112 and a lateral surface 113 extending between the first surface 111 and the second surface 112. An electronic component 121 is disposed on the first surface 111 of the substrate 11. In some embodiments, another electronic component 122 is disposed on the first surface 111 of the substrate 11. In some embodiments, an electronic component 123 is also disposed on the first surface 111 of the substrate 11. An electronic component 261 and/or an electronic component 262 are disposed on the second surface 112 of the substrate 11. A solder mask layer 115 is disposed on the second surface 112 of the substrate 11. An electrical contact 23 is disposed on the second surface 112 of the substrate 11 and the solder mask layer 115.

Figure 12B:
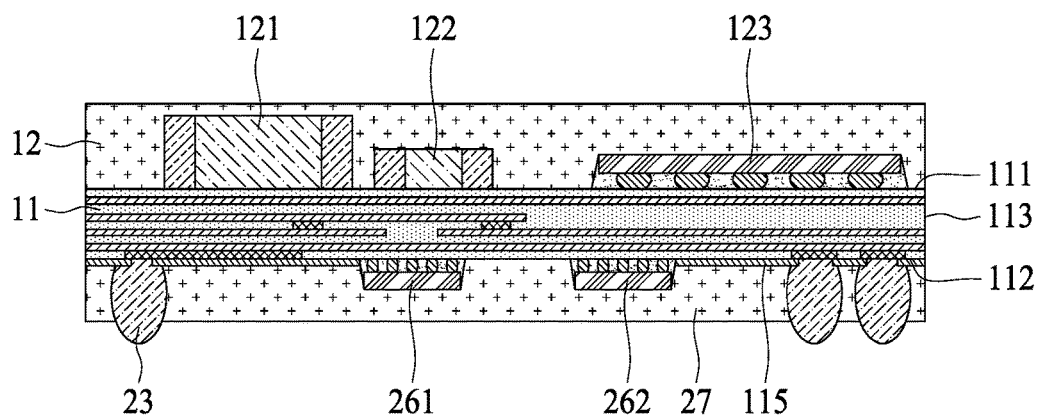

FIG. 12B illustrates disposing a first portion of a molding compound to form a first package body 12 on the first surface 111 of the substrate 11. FIG. 12B also illustrates disposing a second portion of the molding compound to form a second package body 27 on the second surface 112 of the substrate 11. In some embodiments, the first package body 12 encapsulates the electronic components 121, 122 and 123. The second package body 27 encapsulates the electronic components 261 and 262 and the electrical contact 23 and exposes a portion of the electrical contact 23.

Figure 12C:
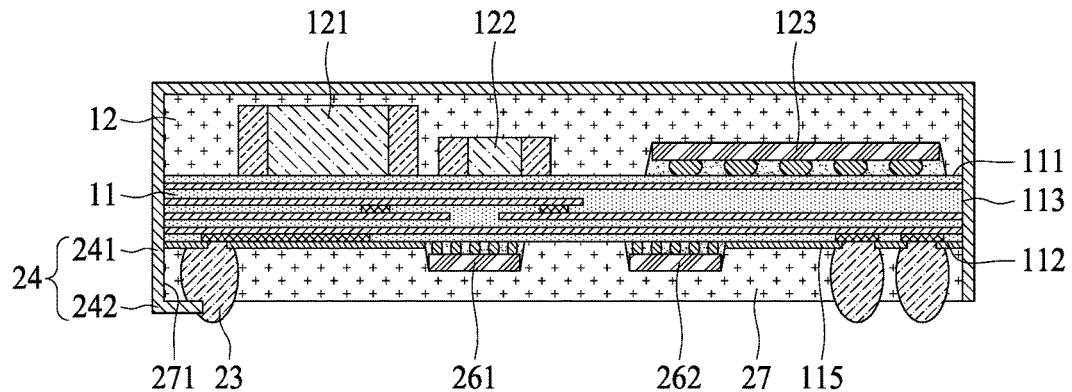

FIG. 12C illustrates forming a conductive layer 24 on the lateral surface 113 of the substrate 11, the first package body 12 and a lateral surface 271 of the second package body 27 shown in FIG. 12B. The conductive layer 24 includes a first portion 241 and a second portion 242. The first portion 241 is disposed on the first package body 12, the lateral surface 113 of the substrate 11 and a lateral surface 271 of the second package body 27. The second portion 242 is disposed on the second package body 27 to contact the electrical contact 23.

Figure 12D:
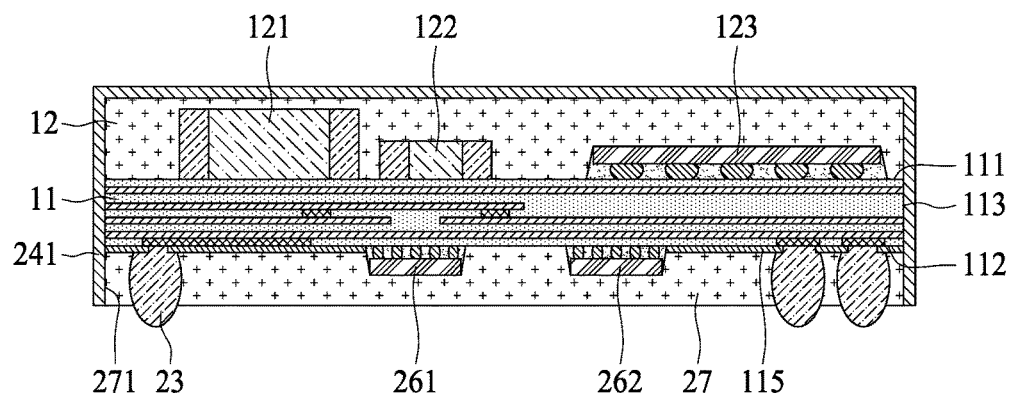

FIG. 12D illustrates forming the first portion 241 of the conductive layer 24 on the lateral surface 113 of the substrate 11, the first package body 12 and the lateral surface 271 of the second package body 27 shown in FIG. 12B. FIG. 12C and FIG. 12D differ in that the second portion 242 of the conductive layer 24 is formed at a different time than first portion 241 of the conductive layer 24 (e.g. the second portion 242 of the conductive layer 24 is formed after the formation of the first portion 241 of the conductive layer 24).

Figure 12E:
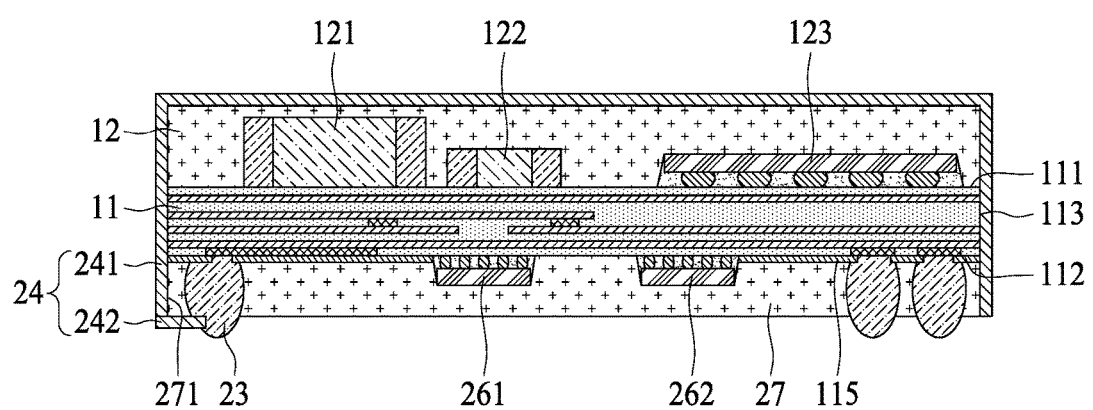

FIG. 12E illustrates forming the second portion 242 of the conductive layer 24 on the second package body 27. The second portion 242 of the conductive layer 24 contacts the electrical contact 23. In some embodiments, the structure shown in FIG. 6B and FIG. 6C is then formed. Finally, the semiconductor device package shown in FIG. 6A is formed.

The semiconductor device packages shown in FIG. 7, FIG. 8 and FIG. 9 can be formed by methods similar to the method of manufacturing a semiconductor device package shown in FIG. 12A, FIG. 12B, FIG. 12C, FIG. 12D and FIG. 12E.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
    a substrate having a first surface, a second surface and a lateral surface extending between the first surface and the second surface;
    a first electronic component disposed on the first surface of the substrate;
    a first package body encapsulating the first electronic component;
    an external connection element disposed on the second surface of the substrate; and
    a first conductive layer including:
        a first portion disposed on the first package body and the lateral surface of the substrate, and
        a second portion contacting a lower surface of the first portion and contacting the external connection element.

2. The semiconductor device package of claim 1, wherein the second portion of the first conductive layer contacts the second surface of the substrate.

3. The semiconductor device package of claim 2, further comprising:
    a second electronic component disposed on the first surface of the substrate;

a first conductive element disposed in the first package body and separating the first electronic component from the second electronic component.

4. The semiconductor device package of claim 2, further comprising:
   a second electronic component disposed on the second surface of the substrate;
   a second package body encapsulating the second electronic component; and
   a second conductive layer disposed on the second package body,
   wherein the second conductive layer is electrically connected to the external connection element.

5. The semiconductor device package of claim 4, further comprising:
   a third electronic component disposed on the second surface of the substrate; and
   a first conductive element disposed in the second package body and separating the second electronic component from the third electronic component.

6. The semiconductor device package of claim 4, wherein the second portion of the first conductive layer comprises a protrusion covering a portion of the external connection element.

7. The semiconductor device package of claim 1, wherein the external connection element covers a portion of the second portion of the first conductive layer.

8. The semiconductor device package of claim 1, wherein a thickness of the first portion of the first conductive layer is greater than a thickness of the second portion of the first conductive layer.

9. The semiconductor device package of claim 8, wherein the thickness of the first portion of the first conductive layer is at least three times greater than the thickness of the second portion of the first conductive layer.

10. The semiconductor device package of claim 1, further comprising:
   a second electronic component disposed on the second surface of the substrate; and
   a second package body encapsulating the second electronic component and the external connection element, the second package body having a lateral surface and a first surface, wherein the external connection element is exposed from the first surface of the second package body;
   wherein the first portion of the first conductive layer is disposed on the lateral surface of the second package body;
   wherein the second portion of the first conductive layer is disposed on the first surface of the second package body.

11. The semiconductor device package of claim 10, further comprising:
   a third electronic component disposed on the first surface of the substrate;
   a first conductive element disposed in the first package body and separating the first electronic component from the third electronic component.

12. The semiconductor device package of claim 11, further comprising:
   a second conductive element disposed in the second package body and surrounding the second electronic component; and
   a second conductive layer disposed on the second package body and connected to the second conductive element,
   wherein the second conductive element is electrically connected to the external connection element.

13. The semiconductor device package of claim 12, further comprising:
   a fourth electronic component disposed on the second surface of the substrate; and
   a third conductive element disposed in the second package body and separating the second electronic component from the fourth electronic component.

14. The semiconductor device package of claim 10, wherein the second portion of the first conductive layer comprises a protruding portion covering a portion of the external connection element.

15. The semiconductor device package of claim 3, wherein the first conductive element is electrically connected to the external connection element.

16. The semiconductor device package of claim 5, wherein the first conductive element is electrically connected to the external connection element.

17. The semiconductor device package of claim 11, wherein the first conductive element is electrically connected to the external connection element.

18. The semiconductor device package of claim 12, wherein the second conductive element is electrically connected to the external connection element.

19. The semiconductor device package of claim 13, wherein the third conductive element is electrically connected to the external connection element.

* * * * *